(12) United States Patent
Malville et al.

(10) Patent No.: US 6,881,596 B2
(45) Date of Patent: Apr. 19, 2005

(54) METHOD FOR AUTOMATICALLY DETERMINING THE SURFACE QUALITY OF A BONDING INTERFACE BETWEEN TWO WAFERS

(75) Inventors: Christophe Malville, La Terrasse (FR); Frédéric Metral, Saint-Quentin sur Isere (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 1 day.

(21) Appl. No.: 10/425,546

(22) Filed: Apr. 29, 2003

(65) Prior Publication Data

US 2004/0005727 A1 Jan. 8, 2004

(30) Foreign Application Priority Data

Apr. 30, 2002 (FR) ............................................ 02 05427

(51) Int. Cl.[7] .......................... G01R 31/20; H01L 21/00
(52) U.S. Cl. .............................................. 438/16; 438/7
(58) Field of Search .............................. 438/16, 7–9, 5, 438/14, 15

(56) References Cited

U.S. PATENT DOCUMENTS 5,407,856 A * 4/1995 Quenzer et al. ............ 438/455
6,197,695 B1 * 3/2001 Joly et al. ................... 438/694

FOREIGN PATENT DOCUMENTS

| JP | 57166505 | 1/1983 |
| JP | 7245470 | 1/1996 |

* cited by examiner

Primary Examiner—Craig A. Thompson
(74) Attorney, Agent, or Firm—Winston & Strawn LLP

(57) ABSTRACT

The invention relates to a device and method for automatically determining the surface quality of a bonding interface between two wafers. The device includes a detector for automatically detecting a bonding wave at a predetermined measuring site to determine when bonding occurs at the measuring site, and a processing unit for automatically calculating the bonding speed based on a location of the measuring site and at least one other predetermined site.

23 Claims, 1 Drawing Sheet a) b) c)

a) b) c)

METHOD FOR AUTOMATICALLY DETERMINING THE SURFACE QUALITY OF A BONDING INTERFACE BETWEEN TWO WAFERS

BACKGROUND

The present invention relates in general to the processing of materials, and more particularly to substrates for electronics, optics, or optoelectronics. Described are a method and device for automatically determining the surface quality of a bonding interface between two wafers. A bonding wave is automatically detected at a predetermined measuring site to determine when bonding occurs at the measuring site, and the bonding speed is automatically calculated based on a location of the measuring site and at least one other predetermined site.

Devices for characterizing the bonding speed between two wafers are known. In particular, when at least one of the wafers is formed from a semi-conductor material such as silicon, then the bonding speed between two wafers of material can be characterized in a known manner. Such wafers generally have a disk-shaped outline and are typically of the order of few hundred microns thick. The wafers can be bonded together to form multi-layer structures, and the two bonded wafers may be of different materials.

Specifications regarding the quality of such wafers can be extremely exacting, in particular as regards wafers used to form substrates of the above-mentioned type. When bonding wafers together, the surface quality specifications are even more stringent, in particular with regard to the surface roughness of the wafer and to the absence of impurities on that surface. It is thus particularly important that high performance means be available to characterize the surface quality.

One known means for characterizing the surface quality of two wafers (at least one wafer may be formed from a semiconductor material such as silicon, and the two wafers having the same disk-shaped outline) operates as follows. The respective surfaces of the wafers are brought into contact to form a stack having the general shape of a disk, and the two wafers are thus placed side by side. The stack formed by the two wafers is then compressed at any point on the stack. Next, the time required to establish a bond between the two wafers following the compression is measured. This time measurement is termed the "bonding time".

"Bonding" actually corresponds to forming hydrogen bonds between the surfaces of the two wafers (more accurately, between OH bonds on the respective surfaces of the two wafers). To determine the bonding speed, an operator records the time between the initial compression and the arrival of a bonding wave at the other extremity of the stack. Infrared radiation is transmitted from a source placed beneath the stack, and the operator observes the stack from above to observe the bonding wave through the wafers (using means such as a screen that reconstitutes the image provided by an infrared camera located above the stack). The bonding speed is representative of the surface quality of the wafers. A high bonding speed indicates good surface quality, while a slower bonding speed indicates the presence of defects and/or impurities on the wafer surface.

The surfaces of wafers leaving a fabrication facility may exhibit several defects and residues which are both chemical in nature (principally OH bonds with superficial wafer particles) and mechanical in nature (typically, roughness defects, the presence of abrasive particles and superficial metallic contaminants). To improve the surface quality, measurement of the bonding speed is generally preceded by cleaning the wafers. Cleaning the wafers may include immersing them in succession in at least one basic dip. This step is intended to develop the hydrophilic characteristics of the wafer, by creating OH type bonds at the surface of the wafer. Next, an acid dip is used to remove contaminating elements (in particular metals) from the wafer surface, which contaminants may have been introduced by preceding wafer processing steps (in particular the basic dip). Thus, a method for characterizing surface quality of wafers is known.

However, the disadvantage of this method is that an observer must manually perform the different steps (placing the wafers on the measuring device, performing the initial compression, followed by observing the bonding wave, timing to determine the bonding speed, etc.). Further, this conventional method requires carrying out measurements of the bonding speed on a dedicated manual device. Therefore, wafer bonding cannot be carried out automatically.

Devices exist which automatically bond wafers, where the goal is to perform operational bonding rather than to characterize the surface quality. An operator could employ such automatic bonding devices to carry out a measurement of the bonding speed in conjunction with bonding, thus producing information regarding the surface quality of the wafer. It is currently not possible to contemplate such a use of automatic bonding devices by an operator because the micromechanisms present above and below a support for positioning, aligning and bonding the wafers do not allow an operator to view the bonding wave. Currently, therefore, a bonding wave can only be characterized in a manual manner using a dedicated device. Consequently, such operation substantially limits the rates that can be obtained.

SUMMARY OF THE INVENTION

The invention relates to a device for automatically determining the surface quality of a bonding interface between two wafers. The device includes a detector for automatically detecting a bonding wave at a predetermined measuring site to determine when bonding occurs at the measuring site, and means for automatically calculating the bonding speed based on a location of the measuring site and at least one other predetermined site to determine the surface quality of the bonding interface.

The detector preferably comprises a source of electromagnetic radiation and a sensor that can detect at least a portion of the spectrum of electromagnetic radiation emitted by the source at the predetermined measuring site of the bonding interface. Also, the means for automatically calculating the bonding speed advantageously is a processing unit. Thus, the processing unit can calculate instantaneous bonding speeds for one or each of a plurality of measuring sites.

The sensor is designed to detect a change in a characteristic of the electromagnetic wave received from the source.

This change is typically a change in contrast. The device includes a bonding support having a passage that allows the radiation from the source to pass to the wafers at the measuring site such that a portion of the radiation passes through the wafers and reaches the sensor.

The detector preferably comprises at least one detection assembly that includes an electromagnetic source, a bonding support with an opening and an electromagnetic sensor, wherein the source and the sensor are aligned adjacent the opening. Thus, the source of electromagnetic radiation is directed towards the measuring site such that the radiation is reflected towards the sensor by the wafer(s). The electromagnetic source may be a lamp or an optoelectronic sensor. Preferably, infrared electromagnetic radiation is emitted by the source.

If desired, a plurality of detector assemblies can be provided for automatically detecting the bonding wave, wherein each detector assembly is associated with a measuring site and allows a local determination of the instant of local bonding to be made at that measuring site. When each assembly is associated with a measuring site, a local determination of the instant of local bonding can be made at that measuring site. For enhanced results, a plurality of passages are respectively associated with the measuring sites.

The invention also relates to a method for automatically determining the surface quality of a bonding interface between two wafers. This method includes the steps of automatically detecting a bonding wave at a predetermined measuring site to determine when bonding occurs at the measuring site; and automatically calculating a bonding speed based on a location of the measuring site and at least one other predetermined site to determine the surface quality of the bonding interface. If desired, the method can include the step of automatically detecting initiation of bonding of the wafers.

Preferably, detection of the bonding wave at the measuring site comprises sensing a change in a characteristic of an electromagnetic wave, with the change being, e.g., a change in contrast. If desired, an infrared electromagnetic wave is utilized, and the bonding wave can be detected at a plurality of measuring sites. The resultant bonded wafer is generally in the range of from one micrometer to a few (i.e., 2 to 3) millimeters thick, and is typically made of silicon. The most preferred structure is an SOI type structure plurality of measuring sites.

BRIEF DESCRIPTION OF THE DRAWINGS

Other embodiments and advantages of the invention will be apparent from the following detailed description with reference to the accompanying drawings in which.

DETAILED DESCRIPTION OF THE PREFERRED EMBODIMENTS

Figure 1:
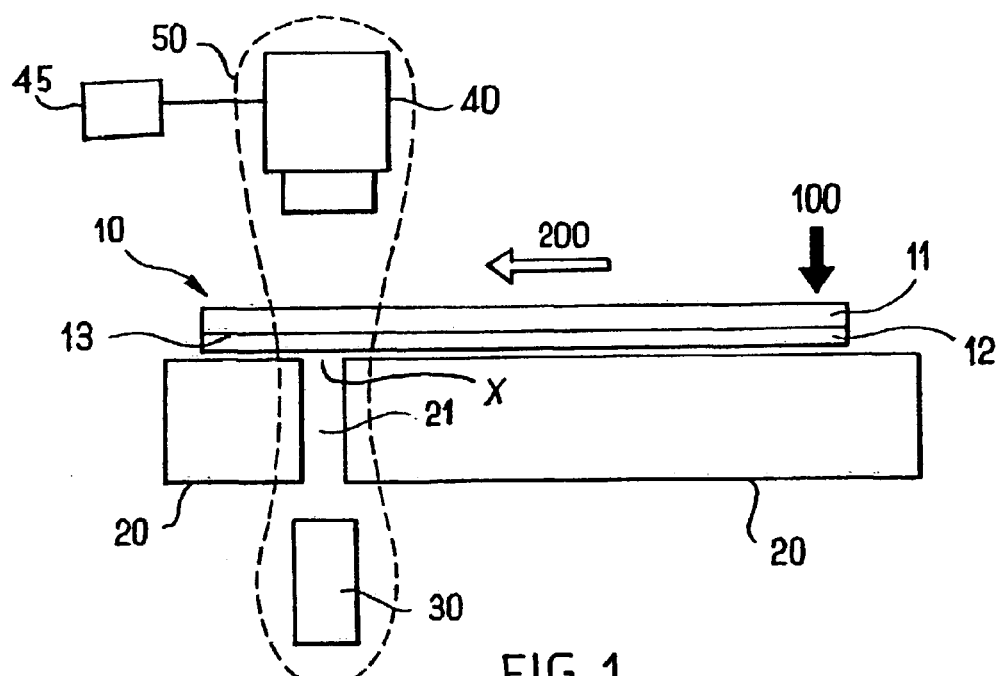
FIG. 1 is a simplified block diagram of a device in accordance with the invention.

FIG. 1 is a simplified block diagram showing a side view of a stack 10 formed by two wafers 11 and 12 placed side by side to define a bonding interface 13 between them. It should be understood that the term "placed side by side" as used in the present text is distinct from the term "bonded". In particular, two wafers that are "placed side by side" are simply disposed in a manner such that they are in contact with each other with no bond existing between them. In contrast; two "bonded" wafers are integral with each other, with bonds (for example hydrogen type bonds) existing between them.

Referring again to FIG. 1, the stack 10 is placed on a bonding support 20. The wafers 11 and 12 may have been immersed in a basic dip and an acidic dip as mentioned above, in order to clean them. FIG. 1 is a simplified block diagram, and it should be understood that the device could also include all of the micro-mechanisms mentioned above concerning known automatic bonding devices. In particular, the device can be formed by modifying a known automatic bonding device. For the purposes of simplicity, such micro-mechanisms (which can be disposed above and/or beneath the wafers) are not shown in the figures.

The support surface 20 must be particularly flat, especially if wafers 11 and 12 have a large surface area and a thickness in the order of a few microns. If the support 20 is not flat, distortions may be caused in the wafer 12 compared with the wafer 11, which could detrimentally affect the stack 10 at the bonding interface 13.

An assembly 50 for detecting the passage of the front of a bonding wave includes a source 30 of electromagnetic radiation and a sensor 40 that can detect at least a portion of the spectrum of the electromagnetic radiation emitted by the source. An opening 21 in the support 20 permits the radiation to reach the stack 10, and the radiation from the source 30 is directed towards the sensor 40 through the opening 21. The radiation is intercepted by the stack 10 when it is positioned as shown on the device. The properties of the materials forming the stack 10 and of the radiation from the source 30 are selected so that a significant portion of the radiation will pass through the stack and will reach the sensor 40. For example, when two silicon wafers are used, infrared radiation and an infrared sensor can be used.

The elements of the assembly 50 do not have to be aligned as shown in FIG. 1 (the source 30 and the sensor 40 are aligned on either side of the opening 21 in this figure). It is possible to provide reflecting mirrors between the source 30, the opening 21 and the sensor 40. In such an implementation, the mirrors route the radiation from the source 30 towards the opening 21, by directing the radiation along the axis of the opening. Mirrors may also be used to route radiation that has passed through the stack to the sensor 40.

The source 30 may be a white lamp, and emissions from the source may encompass the infrared wavelength spectrum. The sensor 40 may be an optoelectronic apparatus.

The opening 21 formed in the support 20 acts as an electromagnetic window and thus allows electromagnetic radiation emitted by the source 30 to pass through the support 20 and ultimately to be detected by the sensor 40. The opening 21 passes through the support 20 at a site X of the support which faces the stack 10 when the stack is positioned on the device. The opening 21 must be sufficiently wide to avoid or to minimize disturbing the electromagnetic waves emitted by the source 30. An opening 21 that is not sufficiently wide may lead to a disturbance of the electromagnetic waves resulting in a substantial loss of signal by reflection from the face of the support 20 closest to the source 30. The disturbances can also be caused by diffraction and/or absorption of the waves. The opening 21 must also be sufficiently narrow to avoid any equipment surrounding the wafers specific to the automatic wafer bonding device. Further, a small diameter opening 21 allows a reduced quantity of radiation to be used, which also reduces the possibility of local heating of the wafers that form the stack. The width of the opening 21 is typically of the order of a few millimeters.

It is also possible to provide a plurality of openings similar to opening 21 at various sites on the support (such sites always face a predetermined portion of the stack 10 when the stack is in position). In such an implementation, the radiation from the source 30 can pass through each opening (by using suitable separating and reflecting mirrors), so that after passing through the stack at the corresponding site via the opening, they reach the sensor 40 (again by using suitable separation and reflection mirrors). It is also possible to provide a specific source and/or sensor in association with each opening (or with some of the openings) to recreate assemblies similar to assembly 50 for each (or some) opening(s).

An implementation of the device functions as follows. A bonding piston (not shown) brings the two wafers 11 and 12 into contact with each other at the interface 13 by exerting an initial pressure 100 (see FIG. 2a) at a predetermined site $X_1$ on the surface of the stack 10, which pressure is sufficient to initiate bonding between the two wafers. The piston is controlled by instructions sent by a central processing unit which is connected to the piston and which stores data concerning the instant at which bonding was initiated. A bonding initiation detector associated with the piston could be used instead to determine the instant bonding is initiated. Such an automatic bonding initiation detector can be a piezo-electric transducer, for example. In all cases, bonding initiation is automatically triggered following an initial instruction, and data associated with the instant that bonding is initiated is stored. The initial instruction can be provided by an operator or by an automatic device that is regulated by time sequences governed by a clock.

The source 30 is activated so that it constantly emits radiation directed through the stack 10 and towards the sensor 40. A bonding propagation wave 200 then propagates over the entire surface of the wafers at the interface 13. When the bonding wave 200 reaches the site "X" on the stack, which is in the area over opening 21, the sensor 40 detects a change in the electromagnetic signal it receives from the source 30 through the stack 10, compared to a reference signal which it was receiving through the same stack before the passage of the bonding wave. This change in the electromagnetic signal typically derives from an optical characteristic of the source radiation. For example, the change in signal can correspond to a change in contrast, revealing the appearance of bonding forces between the two wafers 11 and 12 following the establishment of hydrogen bonds between the two wafers. In the case of a change in contrast, the spectrum of the optical waves emitted by the source 30 is preferably located in the infrared wavelength.

As soon as the sensor 40 detects the passage of the bonding wave at site X, it transmits a signal indicating detection of the passage of the bonding front to a processing unit 45 to which it is also connected. The processing unit 45 then calculates the bonding time, which is the difference between the time that bonding started (which data had been stored) and the time at which the bonding front passes, which physically corresponds to establishing bonding between the wafers.

To calculate this bonding time between the two points of the stack (bonding initiation point $X_1$ and bonding front passage detection point X), the processing unit may also be connected to a clock. Since the distance between the points $X_1$ and X is known and stored in the processing unit, the unit can automatically deduce a bonding speed which is characteristic of the surface quality of wafers 11 and 12 between the measuring sites $X_1$ and X.

Another implementation includes a plurality of through openings 21 distributed over the support 20 so that passage of the bonding wave can be detected at different sites of the wafers 11 and 12. This configuration enables the processing unit to calculate a bonding speed for each of the sites. If a sensor 40 receives signals corresponding to radiation which has passed through different openings in the support to represent different sites of the stack, the sensor includes means for distinguishing between the different signals (the signals can, for example have specific wavelengths as a function of the emission source, or more generally distinguishing characteristics related to the openings). In such an implementation, the processing unit can calculate different "instantaneous" bonding speeds for the different openings. It should be pointed out that the processing unit is connected to all of the sensors 40, and that it receives all of the bonding wave passage signals for the different sites associated with the support 20. The processing unit can then determine the bonding speeds between any two of the sites by calculating the time difference between the passage of the bonding wave at each of the sites (the distances between the different sites associated with an opening in the support being known and stored in a memory of the processing unit). It is possible to provide openings at locations corresponding to sites of the stack at which characterization of the instantaneous bonding speed is particularly desirable. The openings can be disposed so that they are regularly distributed across the expected path of the bonding wave so that any change in the bonding speed can be tracked during propagation of the wave.

In this implementation, a plurality of sensors 40 and/or a plurality of sources 30 may be utilized. In particular, each sensor 40 can be associated with a source 30, wherein each sensor and source are aligned and are located on opposite sides of an opening 21. A plurality of automatic detection assemblies are thus obtained, each resembling the assembly 50 shown in FIG. 1. Such detection assemblies may be used to determine if different bonding speeds occur at different sites of the stack 10, which condition may occur depending on the progress of the bonding wave 200 over the interface 13.

It should be understood that the present device is not limited to the detection means shown in FIG. 1. Any automatic means for detecting bonding initiation, and any automatic means for detecting the instant of passage of the bonding front may be used. In this respect, rather than detecting a change in signal transmitted through the wafers, it is possible to detect a change in signal reflected by the stack 10. It is also possible to produce detection assemblies equivalent to assembly 50 that have a radiation source directed onto a pre-determined site of the stack, but the site reflects radiation from the source to an associated sensor. In this case, changes in the reflected radiation caused by passage of the bonding wave are detected and used to calculate the bonding speeds. The automatic means for detecting the instant that the bonding front passes a site can also comprise one or more automatic detection assemblies that are each suitable for detecting the instant of bonding at a local site.

Referring now to FIGS. 2a to 2c, the action of a local initial compression 100 at $X_1$ on two wafers 11 and 12 in contact (wherein initial compression may be produced by a piston) initiates a bonding wave. A front 200a (FIG. 2a) is produced which then propagates (front 200b of FIG. 2b) and finishes (front 200c) at a site opposite the initial pressure site 100 (FIG. 2c).

In the example of the device shown in FIG. 1, detection assembly 50 is placed close to the wave front 200c at $X_2$. The bonding speed is then determined on the basis of the time taken by the bonding wave to cover the distance separating the site $X_1$, where the initial pressure was exerted at 100, and the site $X_2$, where the point for detecting bonding completion is located.

Figure 2:
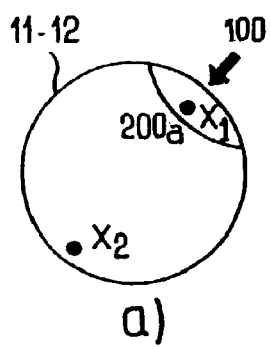
FIGS. 2a, 2b and 2c illustrate an example of the progress of a bonding wave between two stacks placed side by side, and that between them define a bonding interface with no defects.
Figure 2:
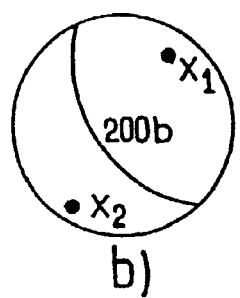
Figure 2:
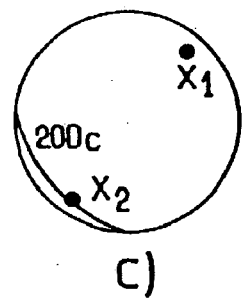
Figure 3:
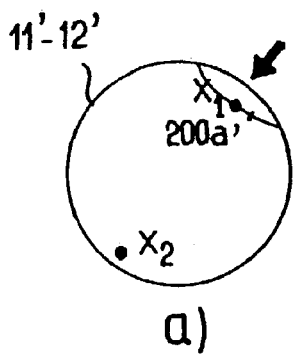
FIGS. 3a, 3b and 3c illustrate an example of the progress of a bonding wave between two stacks placed side by side and that between them define a bonding interface with a defect.
Figure 3:
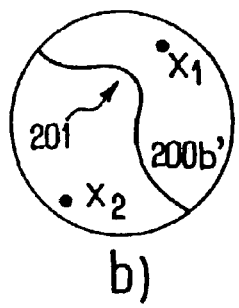
Figure 3:
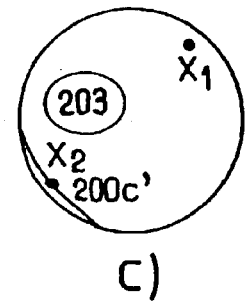

Referring now to FIGS. 3a to 3c, a pressure point 100 similar to pressure point 100 in FIG. 2a is exerted at the site $X_1$ on wafers 11' and 12'. Propagation follows several steps 200a' (FIG. 3a), 200b' (FIG. 3b) and 200c' (FIG. 3c) respectively corresponding to steps 200a, 200b and 200c in FIGS. 2a to 2c. However, propagation is disrupted or disturbed at 201 (FIG. 3b). This disruption is indicative of a surface defect (roughness and/or presence of particulate surface residues) between wafers 11' and 12', which did not exist for wafers 11 and 12. An exemplary defect is shown at 203 (FIG. 3c) which occurred following bonding in the form of a "bubble" between the two wafers. This indicates that bonding has not been properly carried out in site 203 when the principal wave 200c' reaches the periphery of the wafer.

A detection assembly 50 placed at site $X_2$, which is the same site as in the case of FIG. 2, would detect a delay in the arrival of the wave as compared to the arrival time of the wave of FIG. 2, because the wave would have been slowed down by the surface defect 201. This illustrates how measuring a bonding speed can allow the surface quality of the wafer to be automatically determined.

A variation of the device includes a plurality of openings 21 or, in a more general case, an implementation employs a plurality of assemblies to automatically detect the instant of bonding. Such a device can determine bonding dynamics by carrying out local measurements over the entire surface of the stack 10. Such operation results in better surface quality information, along with information regarding the nature and location of any surface defects. In particular, if a sufficiently large number of local instants of bonding are detected over the whole surface of the stack 10, it is then possible to map the surface quality of the wafer.

A device or method in accordance with the invention may be applied to wafers in the field of micro-electronics, namely wafers several centimeters in diameter with thickness measurements on the order of one micron or several tens of microns. This type of wafer contains at least one semiconductor material such as silicon. In an implementation, the wafers comprise SOI (silicon on insulator) type structures. Alternately, one of the wafers (11 or 12) may not be for use in a micro-electronics application and can act as a particularly flat reference wafer, for example.

It should also be noted that the measurements made by a device according to the invention (such as the instant bonding is initiated, the passage of a bonding wave at different measuring sites, etc.) can remain stored in the processing unit along with the parameters deduced therefrom (bonding speeds, etc.). Consequently, it is possible to determine the bonding speeds and therefore the quality of the wafers produced. It is also possible to make use of the stored data as a whole, that is, to apply statistical methods to the procedure.

What is claimed is:

1. A method for automatically determining the surface quality of a bonding interface between two wafers comprising:
   automatically detecting a bonding wave at a predetermined measuring site to determine when bonding occurs at the measuring site; and
   automatically calculating a bonding speed based on a location of the measuring site and at least one other predetermined site to determine the surface quality of the bonding interface.

2. The method according to claim 1, which further comprises automatically detecting initiation of bonding of the wafers.

3. The method according to claim 1 wherein detection of the bonding wave at the measuring site comprises sensing a change in a characteristic of an electromagnetic wave.

4. The method according to claim 3 wherein the change in the characteristic of the electromagnetic wave is a change in contrast.

5. The method according to claim 3 wherein an infrared electromagnetic wave is utilized.

6. The method according to claim 1 which further comprises detecting the bonding wave at a plurality of measuring sites.

7. The method according to claim 1 wherein the resultant bonded wafer is in the range of from one micrometer to a few millimeters thick.

8. The method according to claim 7 wherein the bonded wafer is made of silicon.

9. The method according to claim 7 wherein the structure of the bonded wafer is an SOI type structure.

10. The method of claim 1, carried out in a device comprising:
    a detector for automatically detecting a bonding wave at a predetermined measuring site to determine when bonding occurs at the measuring site; and
    means for automatically calculating the bonding speed based on a location of the measuring site and at least one other predetermined site to determine the surface quality of the bonding interface.

11. The method of claim 10, wherein the detector comprises a source of electromagnetic radiation and a sensor that can detect at least a portion of the spectrum of electromagnetic radiation emitted by the source at the predetermined measuring site of the bonding interface.

12. The method of claim 10, wherein the means for automatically calculating the bonding speed is a processing unit.

13. The method of claim 12, wherein the processing unit can calculate instantaneous bonding speeds for each of a plurality of measuring sites.

14. The method of claim 11, wherein the sensor can detect a change in a characteristic of the electromagnetic wave received from the source.

15. The method of claim 14, wherein the change in the characteristic of the electromagnetic wave is a change in contrast.

16. The method of claim 11, which further comprises providing a bonding support having a passage that allows the radiation from the source to pass to the wafers at the measuring site such that a portion of the radiation passes through the wafers and reaches the sensor.

17. The method of claim 10, wherein the detector comprises at least one detection assembly that includes an electromagnetic source, a bonding support with an opening and an electromagnetic sensor, wherein the source and the sensor are aligned adjacent the opening.

18. The method of claim 11, wherein the source of electromagnetic radiation is directed towards the measuring site such that the radiation is reflected towards the sensor by the wafer(s).

19. The method of claim 11, wherein the source is a lamp.

20. The method of claim 11, wherein the source is an optoelectronic sensor.

21. The method of claim 11, wherein infrared electromagnetic radiation is emitted by the source.

22. The method of claim 11, which further comprises providing a plurality of detector assemblies for automatically detecting the bonding wave, wherein each detector assembly is associated with a measuring site and allows a local determination of the instant of local bonding to be made at that measuring site.

23. The method of claim 16, which further comprises providing a plurality of assemblies for automatically detecting the bonding wave, wherein each assembly is associated with a measuring site and allows a local determination of the instant of local bonding to be made at that measuring site, and wherein a plurality of passages are respectively associated with the measuring sites.

* * * * *

UNITED STATES PATENT AND TRADEMARK OFFICE
CERTIFICATE OF CORRECTION

PATENT NO.      : 6,881,596 B2
DATED           : April 19, 2005
INVENTOR(S)     : Maleville et al.

It is certified that error appears in the above-identified patent and that said Letters Patent is hereby corrected as shown below:

Title page,
Item [12], United States Patent, change "Malville" to -- Maleville --.
Item [75], Inventor, change "Malville" to -- Maleville --.

Signed and Sealed this

Nineteenth Day of July, 2005

JON W. DUDAS
*Director of the United States Patent and Trademark Office*